United States Patent [19]

Armour et al.

[11] Patent Number: 5,438,585
[45] Date of Patent: Aug. 1, 1995

[54] UNSTABLE RESONATOR SEMICONDUCTOR LASER

[75] Inventors: Eric A. Armour; Stephen D. Hersee, both of Albuquerque, N. Mex.

[73] Assignee: University of New Mexico, Albuquerque, N. Mex.

[21] Appl. No.: 250,882

[22] Filed: May 31, 1994

[51] Int. Cl.⁶ .............................................. H01S 3/18
[52] U.S. Cl. ............................................ 372/45; 372/43
[58] Field of Search ........................... 372/45, 50, 43

[56] References Cited

U.S. PATENT DOCUMENTS

| 4,335,461 | 6/1982 | Streifer et al. | 372/45 |
| 4,393,504 | 7/1983 | Botez | 392/45 |
| 5,159,604 | 10/1992 | Mehuys et al. | 372/50 |

Primary Examiner—John D. Lee
Assistant Examiner—Yisun Song

[57] ABSTRACT

A semiconductor laser diode provides high optical power output in a single diffraction-limited farfield lobe using a conventional Fabry-Perot resonant cavity and a planar well graded index separate confinement heterostructure (QW-GRINSCH) active region. An antiguide region is optically coupled to the active region of the laser. In one embodiment, the antiguide region has a lateral variation in the effective index of refraction that forms a diverging medium that causes higher order optical modes to have higher losses in the resonant cavity. The waveguide medium preferably varies in thickness and the thickness approximates a parabolic function in the lateral direction. The antiguide region is enclosed by GaAs layers to minimize oxidation at material interfaces during device fabrication.

8 Claims, 5 Drawing Sheets

UNSTABLE RESONATOR SEMICONDUCTOR LASER

BACKGROUND OF THE INVENTION

This invention relates to semiconductor lasers and, more particularly, to high power semiconductor lasers providing high power output in a single diffraction-limited far field lobe.

Many laser applications require high optical power with spatial coherency. Conventional lasers, i.e., solid-state, gas, and dye lasers, can provide these attributes, but the devices are generally large and complex. There is an increasing need to provide compact, electrically-driven semiconductor lasers in such fields as free-space communications, data storage, frequency doublers, and medical applications.

The most common semiconductor laser structure presently used is the quantum well, graded-index separate confinement heterostructure (QW-GRINSCH). This structure contains a thin (<400 Å) small bandgap quantum well gain layer that is bounded by large bandgap cladding materials that are doped n-type and p-type on opposite sides to form an electrical junction. To reduce bandgap discontinuities and provide a better optical overlap to the gain region, the cladding layers are graded from the high bandgap materials to a lower bandgap alloy in the vicinity of the quantum well. Electrical injection of electrons is provided by a stripe of metal on top of the p-type cladding layer and a large area metal contact on the bottom of the n-type substrate layer. If a forward electrical bias is applied to the stripe, photons are emitted from the gain region as a result of electron-hole recombination. A pair of parallel facet mirrors are cleaved perpendicular to the plane of the junction forming what is known as a Fabry-Perot cavity, which provides the optical feedback to the photons emitted from the gain region. At a certain threshold bias, stimulated emission occurs, whereby the feedback provides an emission of light from the junction.

To achieve high power in semiconductor lasers, the volume where gain occurs must be maximized. Due to quantization of the density of states, quantum well structures have higher gain per injected carrier than standard thick (bulk) active layers. To increase the gain from the quantum well structure, it is necessary to increase the gain volume while maintaining the thin transverse dimension of the quantum well. This might be accomplished by using large stripe widths. However, as stripe widths are increased above about 5 microns, filamentation effects and higher-order lateral modes are supported and the laser output can no longer be focused to a small spot in the far field.

The use of narrow stripes with high injection current densities is not viable either; the higher injected current densities result in reduced device lifetimes. Further, the optical power impinging on the facets is limited to the catastrophic optical damage threshold of about 10 $MW/cm^2$ per facet, which limits the total power obtainable for a given metallization stripe width. Hence, there is a tradeoff with standard Fabry-Perot resonator designs between either having a wide stripe laser having a high output power, but poor coherence, or a narrow stripe laser with good coherence, but limited output power.

To overcome these limitations, many techniques have been examined to achieve high power densities in a single optical mode, including arrays of coupled narrow stripe lasers, master-oscillator power amplifiers, and various unstable resonator geometries. In an unstable resonator laser, the cavity is fabricated such that any light rays that are not directly on the center of the lateral axis tend to diverge out of the lateral boundaries of the cavity. This geometry provides more gain to the fundamental mode, which has its peak energy at the central axis, while higher order modes, which have peak energies off the central axis, experience less gain before they diverge out of the cavity. The net result is that the cavity discriminates in favor of the fundamental mode and the cavity resonates in a single fundamental mode at higher power levels.

In one approach to unstable resonator design for semiconductor lasers, shown in U.S. Pat. No. 5,179,568, issued Jan. 12, 1993, the Fabry-Perot cavity was formed with curved facets for the end mirrors. However, a high precision manufacturing process, such as ion beam milling, is required to maintain losses at the mirrors within acceptable limits. The required high precision does not permit such devices to be formed in quantity and with reasonable reproducibility.

Yet another approach is described in Paxton et al., "Semiconductor Laser with Regrown-Lens-Train Unstable Resonator: Theory and Design," 29 IEEE J. Quantum Electron., No. 11, pp. 2784–2792 (November 1993). A train of weak negative cylindrical lenses is grown into the structure to cause the fundamental mode to expand laterally as it propagates. For large changes in the effective index of refraction, however, each lens will act as a reflecting surface (as well as a diverging element) and will introduce concomitant cavity losses.

One other approach, described in Chan et al., "Antiguiding Index Profiles in Broad Stripe Semiconductor Lasers for High-Power Single-Mode Operation," 24 IEEE J. Quantum Electron., pp. 489–495 (1988), provides a continuous variation of the index of refraction in the lateral dimension, with increasing index of refraction from the center of the resonator, so that the rays of the resonator mode curve away from the center of the laser. Simple, cleaved planar end mirrors may be used. But the device taught by Chan et al. provides an antiguiding layer of $Ga_{0.7}Al_{0.3}As$ regrown on $Ga_{0.85}Al_{0.15}As$. These structures oxidize during the regrowth process with resultant poor electrical and optical performance (see, e.g., G. Guel et al., 21 J. Electron Mat. 1051 (1992)).

Thus, the unstable resonator approach provides a means of obtaining a high power output with spatial coherency. In accordance with the present invention, a standard Fabry-Perot cavity is provided for laser resonance and a continuous, diverging medium is formed in the semiconductor structure, without significant oxidation effects, to cause higher order lateral modes to diverge out of the pumped region.

Accordingly, it is an object of the present invention to provide a semiconductor laser with a standard Fabry-Perot cavity for optical feedback and a continuous internal structure for removing unwanted higher order lateral lasing modes.

It is also an object of the present invention to provide an antiguide layer for filtering out high order modes while enclosing the antiguide layer in cladding that is not subject to oxidation that cannot be removed.

Another object of the present invention is to provide a semiconductor laser with reduced scattering and reflection losses.

Yet another object of the present invention is to remove unwanted higher order modes from the resonant cavity before amplification of the unwanted modes.

One other object of the present invention is to provide an unstable resonator that is easily manufactured with reproducible characteristics.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise an improved semiconductor laser diode with a high optical output power in a single spatial mode and standard planar cleaved facets, a planar well graded index separate confinement heterostructure (QW-GRINSCH) active region. The improvement is an antiguide layer defining first and second surfaces and having a continuous lateral variation in index of refraction effective to form a waveguiding medium for undesired higher order optical modes resonating in a resonant cavity defined by the cleaved facets. First and second layers of GaAs overlie the first and second surfaces, respectively, to enclose the antiguide layer.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Figure 1A:
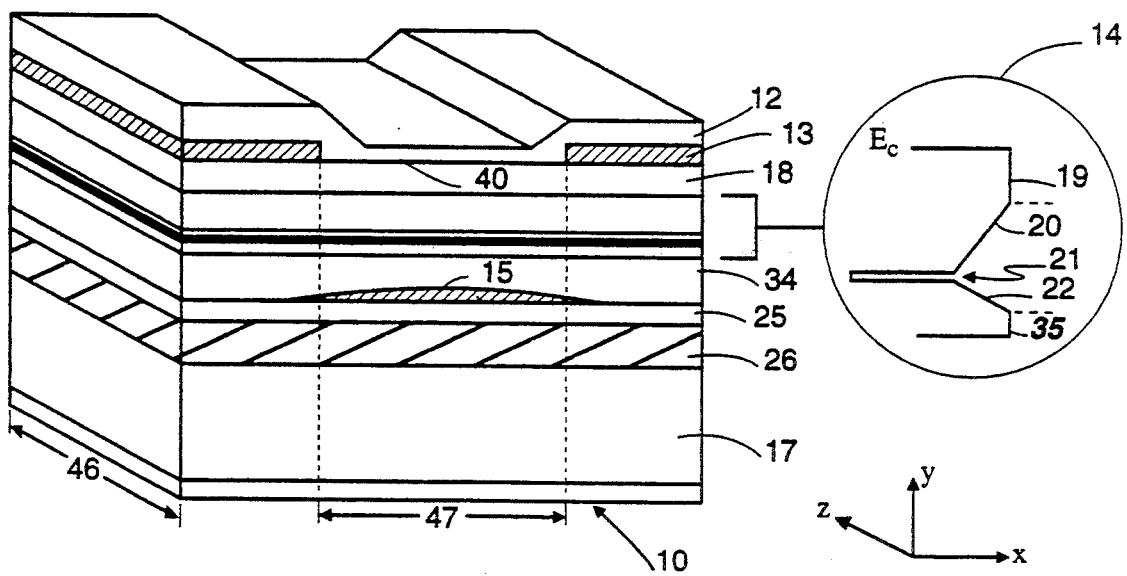
FIG. 1A is a perspective cross-sectional view of a laser diode according to the present invention with an antiguide region below a QW-GRINSCH region.

According to the present invention, an unstable resonator semiconductor laser is obtained by creating a lateral variation in the effective index of refraction within the gain region while maintaining a cleaved Fabry-Perot cavity for optical feedback. The structure of a device formed according to the invention includes an assymetric planar QW-GRINSCH design, but also includes an antiguide layer of varying thickness that is coupled to the transverse optical mode supported by the GRINSCH and is clad with GaAs. As used herein, the longitudinal or "z" direction is the direction of light propagation; the lateral or "x" direction is the direction of the waveguiding action for the higher order modes; and the transverse or "y" direction is the direction of optical coupling for the resonant modes.

In one embodiment the antiguide layer has a lower refractive index than the surrounding cladding layer and is thicker at the center than at the edge of injection stripe. The variation in refractive index and thickness provide a gradual effective index of refraction profile that is low in the center of the device and increases at the outer lateral edges of the antiguide layer. The effective index of refraction serves as a diverging waveguiding medium for light propagating in the longitudinal (z) direction that preferentially diverges higher order lateral optical modes out of the pumped cavity region. To reduce or prevent scattering or reflection optical losses, the antiguide layer generally maintains lateral (x) uniformity along the longitudinal (z) length of the device. A metal injection stripe on the semiconductor device, as explained below, may not be as wide as the antiguide layer, but the injection stripe and antiguide layer are preferably concentric for optimum performance.

The degree of antiguiding, i.e., of optical waveguiding, and, hence, the round-trip lateral (x) magnification of the cavity, depends upon the effective lateral (x) profile of the device index of refraction. The effective index of refraction at a given lateral (x) position in the cavity is a function of many parameters, such as the thickness and composition of the antiguiding layer, the GRINSCH structure, the cladding layer compositions, and the position of the antiguiding layer with respect to the optical cavity. Ideally, the effective index of refraction should maintain a quadratic lateral dependence. Following the theory taught by Paxton et al., supra, if an unstable resonator has a quadratic lateral effective profile of the index of refraction given by $$n = n_0 + n_2 x^2$$

where x is the lateral coordinate with $x=0$ being the center of the injection stripe, then the optical modes have cylindrical wavefronts in the lateral (x) direction with a radius of curvature given by $$r = \sqrt{\frac{n_0}{2n_2}}$$

where $n_0$ is the refractive index at the center of the stripe and $n_2$ is a constant that reflects the strength of the antiguiding, as defined by Paxton.

The radius of curvature is constant throughout the laser, unlike unstable resonators with curved facets, and the longitudinal optical mode rays follow positive exponential curves. The magnification M of the continuous unstable resonator is then given by $$M = \mathrm{Exp}\left[2L\sqrt{\frac{2n_2}{n_0}}\,\right]$$

where L is the longitudinal length of the cavity.

The creation of the quadratic effective index profile due to a laterally-varying antiguide layer embedded within an otherwise planar structure requires multiple epitaxial growth steps. The preferred epitaxial method for constructing these devices is conventional metalorganic chemical vapor deposition (MOCVD). It is preferable to create the antiguide layer by growth through a removable shadow mask as described in U.S. Pat. No. 4,448,797. However, the antiguide layer can also be created by selectively etching a planar layer. The advantage of using shadow masking is that an epitaxial mask can be created in the growth sequence prior to the non-planar growth and the resulting shadow mask growth within the window will be smooth.

The device as further described below advantageously combines conventional, simple processing steps with a standard Fabry-Perot laser design using cleaved facets. Further, the device retains a standard gain-guided waveguiding design and the emitting aperture and current injection area are increased while maintaining operation in the fundamental lateral optical mode. Hence, the maximum optical output power is increased, while reducing the optical flux density through the facets.

As herein shown in the Figures, the present invention is depicted as a semiconductor laser providing high output powers in a single far field lobe. For purposes of illustration, the laser devices are described in the GaAs/AlGaAs material system with reference design thicknesses. However, it will be apparent to those skilled in the art that the principles described below are applicable to other material systems, i.e., semiconductor materials formed from selected elements in Group III (B, Al, Ga, In) and Group V (N, P, As, Sb, Bi) of the Periodic Table and selected elements from Group II (Zn, Hg, Cd, Mg) and Group VI (S, Se, Te) of the Periodic Table.

Figure 1B:
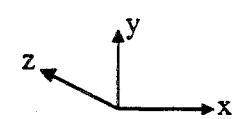
FIG. 1B is a magnified view of the conduction band energy $E_c$ configuration of the assymetric GRINSCH region.

FIG. 1A depicts a perspective cross-sectional view of one embodiment of a semiconductor laser 10 according to the present invention. Semiconductor laser 10 includes nonplanar antiguide region 15 that is operatively located adjacent graded index separate confinement heterostructure (GRINSCH) gain region 14. Antiguide layer 15 has first and second surfaces that are clad with first and second GaAs layers 25 and 34, respectively. The use of GaAs minimizes oxidation at material interfaces and allows these interfaces to have good electrical and optical quality. GRINSCH region 14 has an asymmetric conduction band ($E_c$) profile, as shown in FIG. 1B, to shift the transverse optical mode (see FIGS. 8 and 9) towards antiguide region 15. The width of metallization contact 12 is defined by window 40 etched in a $SiO_2$ or $Si_3N_4$ layer 13.

In a preferred method of fabrication, three growth steps using metalorganic chemical vapor deposition (MOCVD) are conducted on substrate 17, which may be a n-doped (100)-oriented gallium arsenide (GaAs) material. In the first growth step, shown in FIG. 2, a n-type cladding layer 26 of approximately 1.5 micron thick $Al_{0.4}Ga_{0.6}As$ is grown, followed by a 500 angstrom n-GaAs passivation layer 25, a 3-15 micron $Al_{0.6}Ga_{0.4}As$ spacer layer 61 and a 1 micron thick GaAs mask layer 62. Window stripe 66 is then photolithographically defined on mask layer 62 and chemical etchants are used to etch mask layer 62 and spacer layer 61, while undercutting mask layer 62. The photolithographic masking and etching is conventional and is not part of the present invention.

Figure 3:
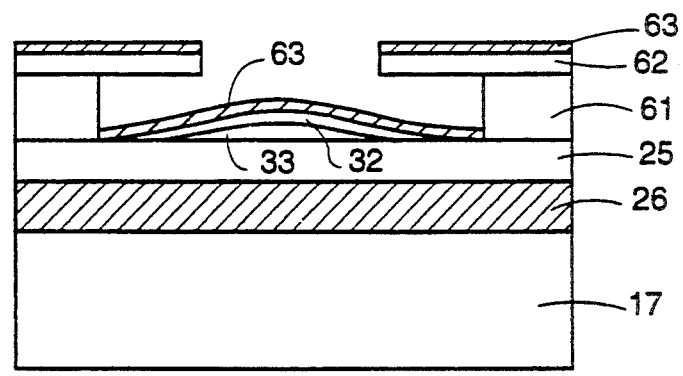
FIG. 3 is a cross-sectional view of FIG. 2 with spun-on photoresist prior to removal of spacer and mask layers.

The second growth step, which occurs through the opening in mask layer 62 defined by window stripe 66, is known as shadow mask growth and is described in Demeester et al., "Non-Planar MOVPE Growth Using a Novel Shadow-Masking Technique," 107 J. Crystal Growth, pp. 161–165 (1991) and U.S. Pat. No. 4,448,797. The shadow mask growth, as shown in FIG. 3, provides the antiguide region 15 (FIG. 1) which consists of a $n$-$Al_{0.7}Ga_{0.3}As$ layer 33 having a central thickness 1000 angstroms-0.5 microns along with a n-GaAs layer 32 having a thickness of 300–1000 angstroms. The thicknesses described above provide a lateral difference in the effective index of refraction of approximately 0.0005–0.025 between the center and the edges of the resulting antiguide region 15 (FIG. 1) over a distance of 20–200 $\mu$m, while maintaining a single optical transverse mode. After the second growth, photoresist 63 is spun onto the structure to protect layers 32 and 33 while spacer 61 and mask 62 are etched away. Photoresist 63 covering layer 32 is then removed using UV or plasma ozone treatments.

Figure 4:
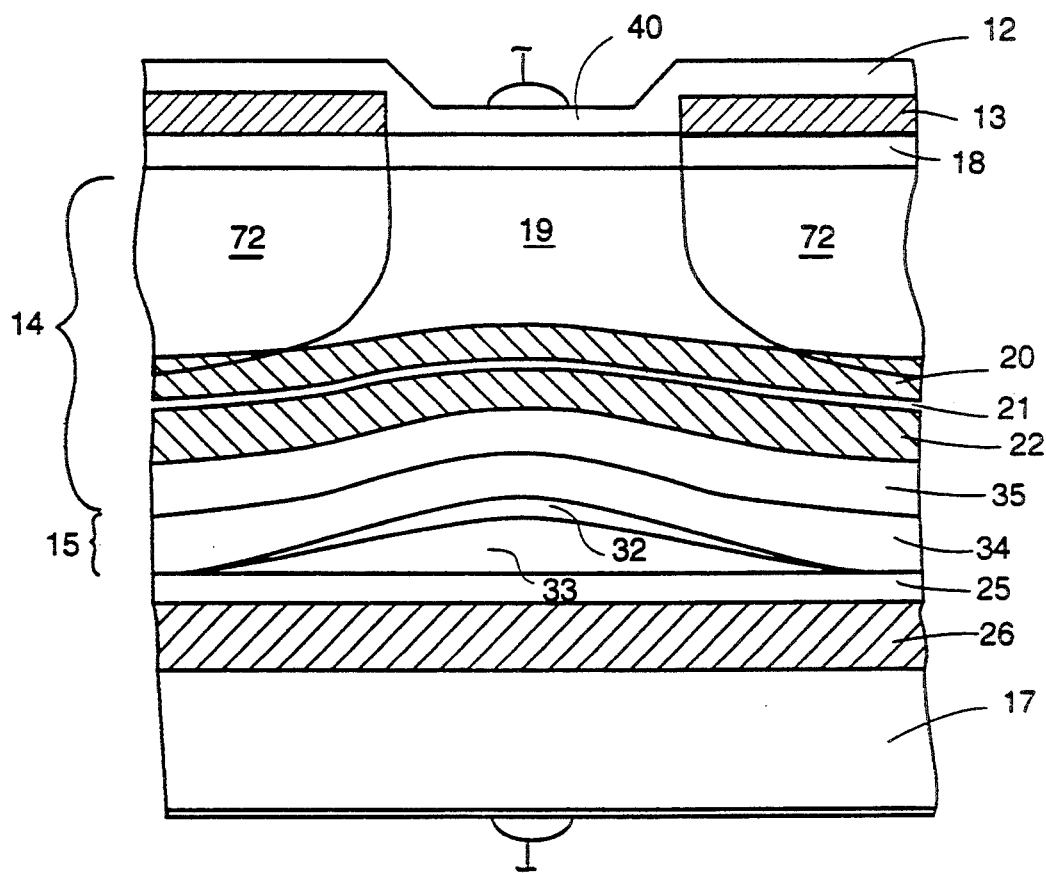
FIG. 4 is a cross-section of a completed laser diode structure after a third epitaxial growth, oxide stripe definition, metallization, and ion implantation.

Referring to FIGS. 1 and 4, the third and final growth step is composed of a thin (50–100 angstroms) n-GaAs regrowth layer 34, a 0.2 micron thick n-$Al_{0.4}Ga_{0.6}As$ cladding layer 35, the asymmetric undoped GRINSCH region 14 with 100 angstrom thick quantum well (QW)21 of $In_{0.15}Ga_{0.85}As$, bounded by barriers from compositions of $Al_{0.2}Ga_{0.8}As$ to $Al_{0.4}Ga_{0.6}As$ of thicknesses 1000 angstroms 22 below QW 21 and 3000 angstroms 20 above QW 21, a 1.5 micron thick upper cladding layer 19 of p-$Al_{0.4}Ga_{0.6}As$, and a 1000 angstrom thick contact layer 18 of p+-GaAs. Metal contact stripe 40 is then defined through dielectric 13. To prevent significant current spreading in the upper regions of semiconductor laser, a proton implant region 72 may be formed by conventional ion implantation techniques.

Figure 2:
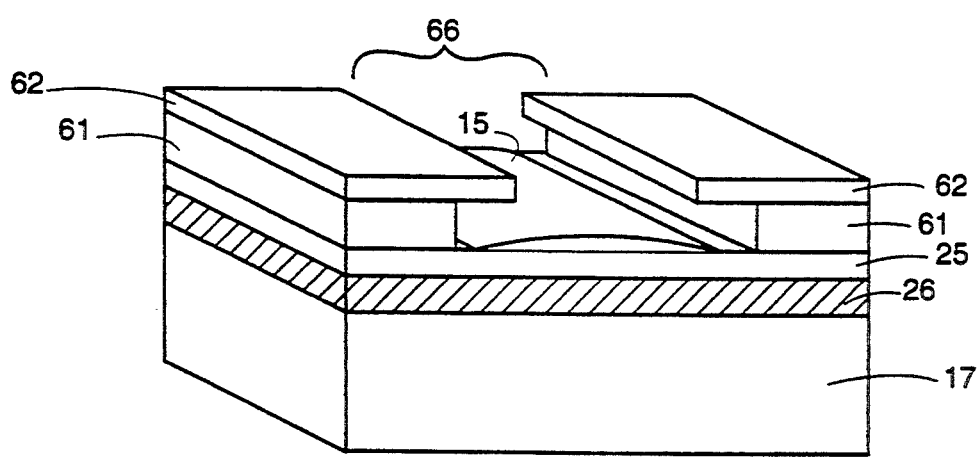
FIG. 2 is a perspective cross-sectional view of a shadow mask region after a second epitaxial growth step.
Figure 5:
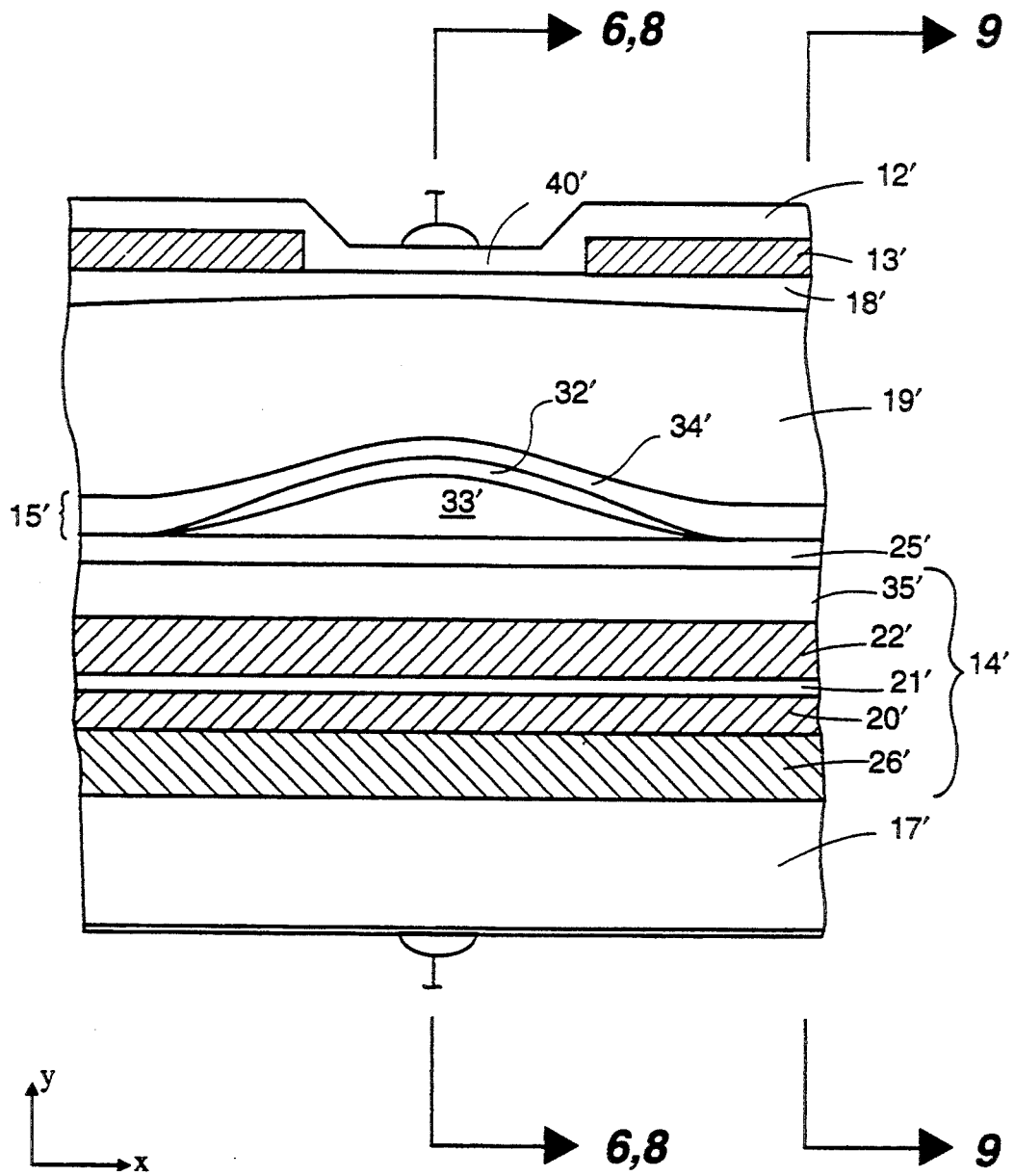
FIG. 5 is a cross-section of an alternate device structure with an antiguide region above the QW-GRINSCH region.

FIG. 5 depicts in cross-section an alternate geometry for antiguide layer 15 (FIGS. 1 and 2). The semiconductor layers depicted in FIG. 5 are prime numbered and each layer is the same as the corresponding unprimed semiconductor layers depicted in FIGS. 1 2, and 4, with the same composition and geometry as discussed therein and is not separately discussed for FIG. 5. In the alternate geometry, GRINSCH region 14 (layers 20', 21', 22', 26', and 35') has an inverted assymetry from the structure as shown in FIG. 1, with thinner graded cladding 22'on top (closer to window 40') rather than on the bottom. In addition, antiguide region 15' (layers 32',33'), GaAs passivation layers 25', 32', and 34', and thin cladding layer 35' of $Al_{0.4}Ga_{0.6}$are doped with a p-type dopant (e.g., Zn, C, Mg) rather than a n-type dopant (e.g., Si, Te, S, Se). Again, antiguide region 15' is clad with GaAs layers 25' and 32'. The same design thicknesses may be used for the geometry of FIG. 4 as in the structure of FIG. 5, but the resulting effective differences in the index of refraction will be slightly different due to slight asymmetries between the structures.

Figure 6:
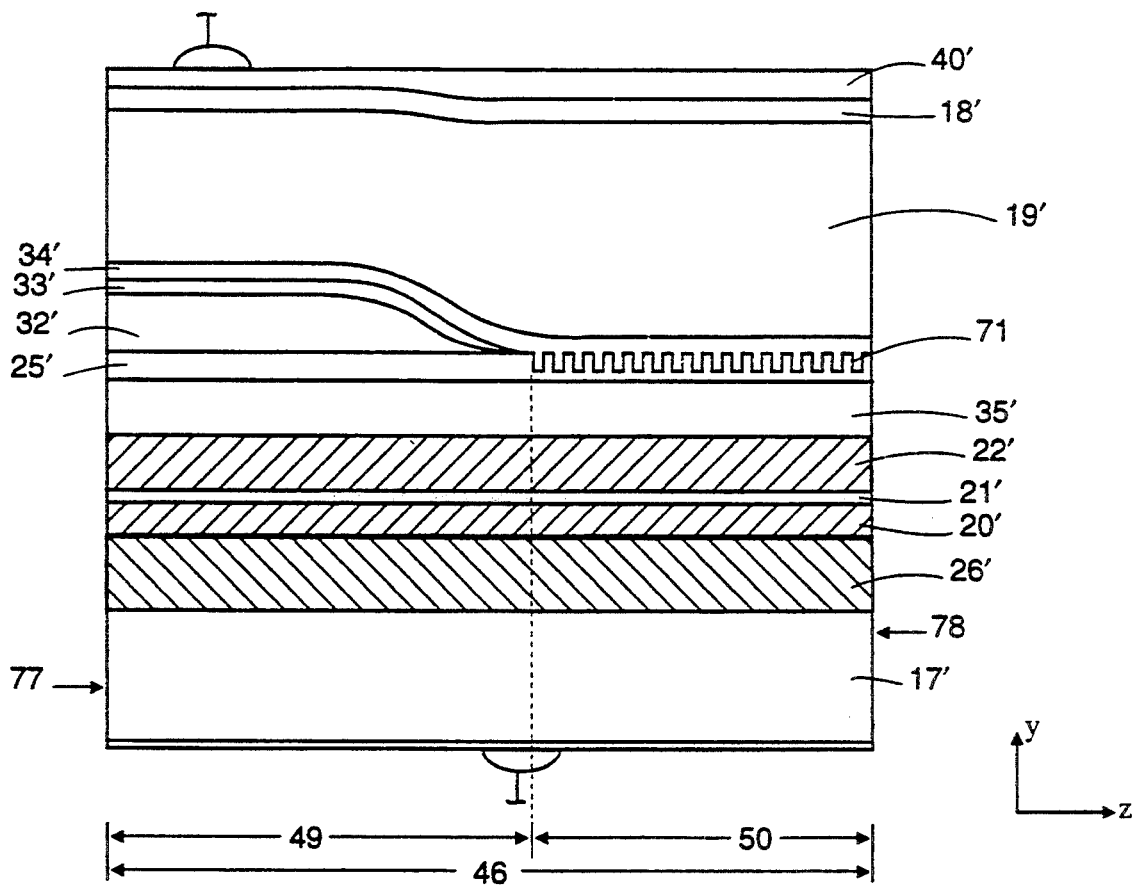
FIG. 6 is a longitudinal cross-section of the device shown in FIG. 5 incorporating a distributed feedback (DFB) region outside of the antiguide region.

To maintain single optical mode operation, it is necessary to limit not only fundamental transverse (y) and lateral (x) mode waveguiding, but also longitudinal optical modes. Hence, a conventional distributed feedback (DFB) might be used as shown in FIG. 6 to maintain single longitudinal optical mode operation. The device fabrication steps outlined above are compatible with the creation of DFB gratings. DFB grating 71 (having a selected longitudinal length 50) can be etched into GaAs passivation layer 25' outside the longitudinal length 49 of antiguide region 15' and before back facet face 78. This fabrication step can occur prior to the third growth step after shadow mask layers 61 and 62 (FIGS. 2 and 3) have been removed.

Figure 7:
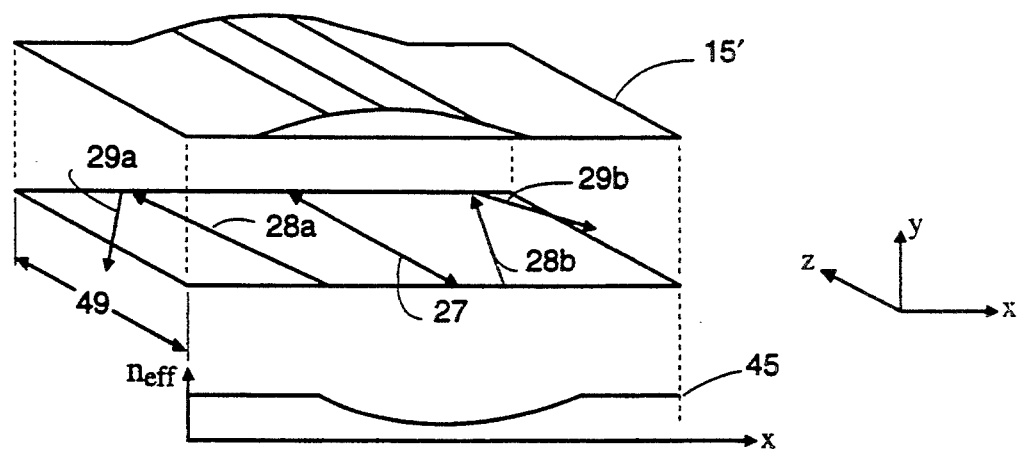
FIG. 7 is a three-dimensional perspective view of the antiguide region, showing the lateral thickness and effective index of refraction variation and illustrating the defocusing effect.

As pictorially shown in FIG. 7, nonplanar antiguide region 15' extends along the longitudinal (z-direction) direction 49 of the device structure. Ideally, antiguide region 15' exhibits a lateral thickness variation that provides a parabolic profile 45 of effective refractive index $n_{eff}$ in the lateral (x) direction. With such a profile, optical beams with a peak intensity aligned with the central lateral (z) axis 27 will have less divergence than off-axis beams; however, any beams that are off-axis, e.g., beams 28a and 28b, will diverge as beams 29a, 29b, respectively, out of antiguide region 15'.

Figure 8:
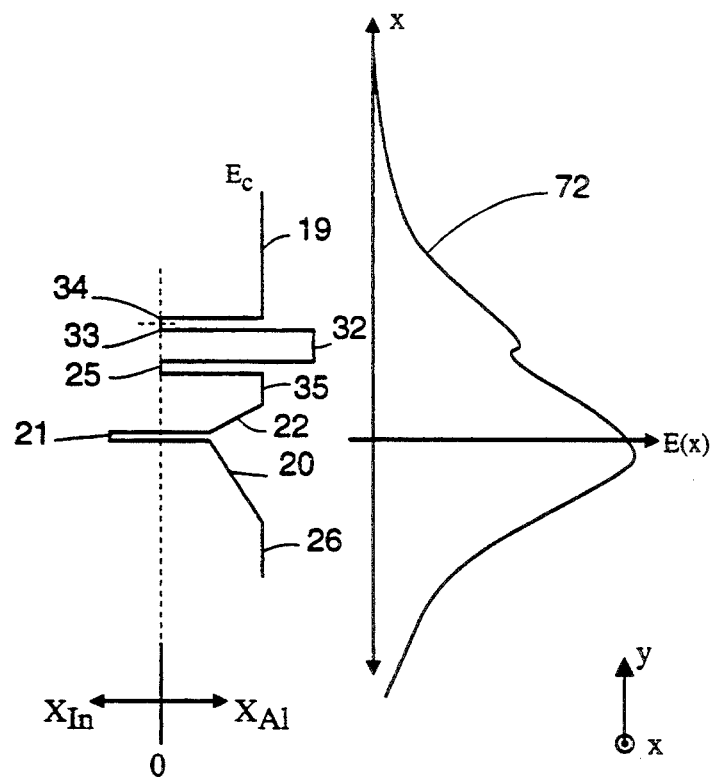
FIG. 8 graphically depicts the transverse optical mode intensity profile at the center of the injection stripe for a device having the structure shown in FIG. 5.
Figure 9:
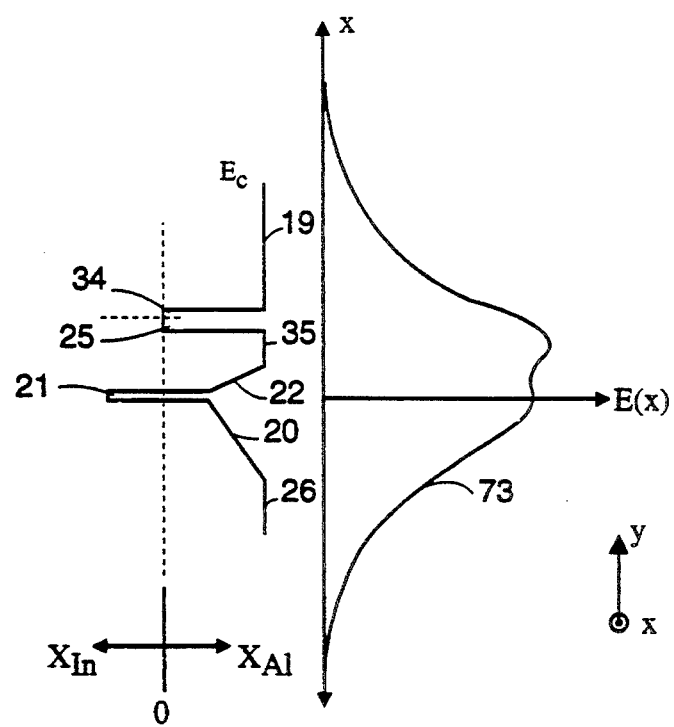
FIG. 9 graphically depicts the transverse optical intensity profile, as in FIG. 8, at the edge of the injection stripe.

The transverse optical mode 72 in the center of the stripe has its peak intensity aligned with QW 21, as shown in FIG. 8. However, at the edges of the stripe, the transverse optical mode 73 is distributed more evenly over both the QW region 21 and antiguide region 15, (layers 32, 33, and 34), as shown in FIG. 9. In both FIGS. 8 and 9, conduction band energy ($E_c$) is shown for the material layers forming the semiconductor laser 10. As shown in FIGS. 8 and 9, the notation $X_{In}$ indicates an increasing concentration of In and the notation $X_{Al}$ indicates an increasing concentration of Al to form the indicated conduction band energy levels.

The above description is directed to an antiguide medium that acts to diverge off-axis beams from the Fabry-Perot cavity in order to suppress the high order beams. However, antiguide medium 33, (see, e.g., FIG. 4) can also act to converge all of the modes to the central axis if a high power and spatially incoherent beam is needed. In this case, a focusing waveguide medium is formed in place of antiguide medium 33 by replacing layer 33 with GaAs and layer 34 with $Al_{0.4}Ga_{0.6}As$.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. In a semiconductor laser diode that provides high optical power in a single spatial mode and that includes cleaved facets, a planar well graded index separate confinement heterostructure (QW-GRINSCH) active region, the improvement comprising:

an antiguide layer defining first and second surfaces and optically coupled to said active region; said antiguide layer having a lateral variation in effective index of refraction effective to form a waveguide medium for higher order optical modes resonating in a resonant cavity defined by said cleaved facets; and first and second clad layers of GaAs overlying said first and second surfaces to enclose said antiguide layer.

2. The semiconductor laser diode of claim 1, where said waveguide medium is formed by laterally varying said antiguide layer in thickness.

3. The semiconductor laser diode of claim 2, where said antiguide layer thickness varies laterally approximately as a parabolic function.

4. The semiconductor laser diode of claim 1, where said antiguide layer is formed from a semiconductor of compounds of elements selected from Group III consisting essentially of B, Al, Ga, In and Group V consisting essentially of N, P, As, Sb, Bi or Group II consisting essentially of Zn, Hg, Cd, Mg and Group VI consisting essentially of S, Se, Te.

5. The semiconductor laser diode of claim 1, wherein said antiguide layer is formed between said active region and a current injection stripe.

6. The semiconductor laser diode of claim 1, wherein said active region is between a current injection stripe and said antiguide layer.

7. The semiconductor laser diode as in one of claims 1 through 6, where said waveguide medium is a diverging medium to suppress unwanted higher order modes.

8. The semiconductor laser diode as in one of claims 1 through 6, where said waveguide medium is a converging medium to focus higher order modes.

* * * * *